(12) United States Patent
Nouel

(10) Patent No.: US 6,406,833 B1
(45) Date of Patent: Jun. 18, 2002

(54) USE OF FREQUENCY-MODULATED SCREENING FOR LIGHTENING OFFSET PRINTING SURFACES

(76) Inventor: Jean-Marie Nouel, Hauts de Busseau, 77760 Villiers-sous-Grez (FR)

( * ) Notice: Subject to any disclaimer, the term of this patent is extended or adjusted under 35 U.S.C. 154(b) by 0 days.

(21) Appl. No.: 08/765,788

(22) PCT Filed: Jul. 12, 1995

(86) PCT No.: PCT/FR95/00935

§ 371 (c)(1),
(2), (4) Date: Jan. 13, 1997

(87) PCT Pub. No.: WO96/02868

PCT Pub. Date: Feb. 1, 1996

(30) Foreign Application Priority Data

Jul. 13, 1994 (FR) .............................. 9408726

(51) Int. Cl.$^7$ ................................. G03F 7/00
(52) U.S. Cl. ................. 430/302; 430/303; 101/453
(58) Field of Search ................. 101/453, 454, 101/455, 456, 457, 458, 459; 430/302, 303

(56) References Cited

U.S. PATENT DOCUMENTS

| 809,157 A | * | 1/1906 | Weyl | |
|---|---|---|---|---|
| 2,082,475 A | * | 6/1937 | Zoller | 95/81 |
| 2,130,735 A | * | 9/1938 | Eckhardt | 95/5.7 |
| 3,581,660 A | * | 6/1971 | Rapoport et al. | 101/450 |
| 4,037,533 A | | 7/1977 | Rapoport | 101/211 |
| 5,175,804 A | | 12/1992 | Wittmann | 395/108 |
| 5,283,154 A | | 2/1994 | Stein | 430/303 X |
| 5,379,118 A | * | 1/1995 | Steinhardt et al. | 358/298 |
| 5,818,604 A | * | 10/1998 | Delabastita et al. | 358/298 |

FOREIGN PATENT DOCUMENTS

| EP | 552 | * | 2/1979 |
| DE | C457654 | | 4/1927 |
| DE | 2408774 | * | 9/1975 |
| EP | 0620674 | * | 10/1994 |
| FR | 2026473 | | 9/1970 |
| FR | 2660245 | | 10/1991 |

OTHER PUBLICATIONS

Deutscher Drucker, vol. 30, No. 6, Feb. 1994 Ostfildern DE, pp. W11–W15.
P Urban Die freie Kantenlange: Indikator der Tonwertzunahme bei frequenzmodulierter Rasterung' the see whole document—see page D.
Deutscher Drucker, vol. 30, No. 6, Feb. 1994 Ostfildern DE, pp. W11–W15.
J. Brunnenberg 'Erste Praxiserfahrungen mit Feinrastern und FM–Rastern' see the whole document.

* cited by examiner

*Primary Examiner*—Cynthia Hamilton
(74) *Attorney, Agent, or Firm*—St. Onge, Steward, Johnston & Reens LLC

(57) ABSTRACT

The present invention relates to the use of the frequency-modulated screening or stochastic screening for lightening the printing surfaces, in waterless or wet offset printing techniques. It also concerns the films and plates used in these printing techniques which, in characteristic manner, generate printing surfaces lightened by means of a stochastic screening (or frequency-modulated screening).

6 Claims, No Drawings

USE OF FREQUENCY-MODULATED SCREENING FOR LIGHTENING OFFSET PRINTING SURFACES

The present invention relates to printing and has for a more particular object an original use of the frequency-modulated screening in wet or waterless offset, as well as films and plates modified depending on said screening.

It is known that wet and waterless offset printing techniques use supports or plates which comprise surfaces for absorbing the ink, so-called inkphilic surfaces, and surfaces for rejecting said ink, so-called non-inkphilic surfaces. In wet offset, the ink is rejected by a very thin film of water which adheres on the hydrophilic surfaces. In waterless offset, the inkphilic surfaces are based on a coating of silicones (on which the ink does not adhere). Said inkphilic and non-inkphilic surfaces are generated on said plates by techniques of exposure which employ films or directly from software.

On the printing machine, rollers coated with ink deposit said ink only on said inkphilic surfaces of a plate. A blanket, rubber-coated fabric, takes the ink of said ink-philic surfaces of said plate and deposits it on the material to be printed. It may be question of paper, cardboard, metal, etc.

It is therefore of prime importance, in order to obtain a correct result, that the ink catches successively on the ink-philic surfaces of the plate and then on the rubbery surface of the blanket and that it is finally deposited on the material to be printed.

Within the framework of wet offset, the ink should, furthermore, be mixed with a little of the water used for wetting the hydrophilic (inkphilic) surfaces.

The images are produced between two values which are, on the one hand, the "zero" value, i.e. the colour of the material to be printed, blank, and, on the other hand, a "maximum" value, i.e. the solid tint made with the chosen ink (black for black ink). All the intermediate values are obtained by using a screen, which is constituted by thousands of small squares. These may be empty—they represent a white surface, without ink—partially filled, or filled up to solid tint. All the shades are thus reproduced by solid tints of more or less large area. Said solid tints generally consist of dots, equidistant from one another, of an increasing diameter. Amplitude-modulated screens are spoken of. With this conventional screening, the reproduction of a half-tone image passes by the arrangement at equidistance of dots of which the size varies proportionally to the value of the tones of the original.

The screens are qualified by their number of lines to the linear inch.

Depending on the printing process employed and the nature of the material to be printed, more or less fine screens are used, such as screens 65, 80, 100, 120, 150, 175.

Ordinary, cheap papers such as newspaper paper, require a film of fluid, thick ink to cover their rough and absorbent surface. To print such papers, a large screen will have to be used: 65 or 80, for example. Good quality papers, which present a smooth, homogeneous surface, may be printed with a film of ink which is thin and concentrated in pigments. In this context, a very fine screen, 150 for example, may be used.

On carrying out the conventional techniques of which the principal characteristics have been recalled hereinabove, problems of the type set forth hereinbelow are frequently encountered.

The water-ink mixture, in wet offset, is not always made satisfactorily. It may contain too much water or, inversely, not enough water. The quality and productivity of the print are then penalized insofar as said ink may drip, dry poorly, remain on the blanket, etc.

The material to be printed, such as paper, does not always take all the ink deposited on the blanket. Said ink accumulates, "thickens", on said blanket. It is then necessary to interrupt printing and to wash said blanket.

The surface of the material to be printed, such as paper, leaves on the blanket residues, in the form of dust. The volume of residues is all the greater as the quality of the material to be printed is lower. When said volume attains certain limits, the blanket should also be washed.

The ink deposited on the blanket catches on the material to be printed. If the latter is fragile (case of paper), it will tear from time to time. Pieces of it then remain adhering on said blanket. Said pieces must then be removed and the blanket washed.

On sheet machines, there is also a particular problem insofar as, in the same way, the ink deposited on the blanket "sticks" or, "draws" the material to be printed (the sheet of paper). The latter, held by clips, then slides very slightly. Any slide, even of very small amplitude, brings about a deformation of the print, called double printing.

In wet offset, the reproduction of the screened images systematically undergoes an enlargement, of more or less great amplitude, qualified as "fattening". Such "fattening" affects the quality of the print a great deal, and it weighs it down, particularly on cheap papers (papers which oblige the printers to work with fluid inks).

In waterless offset, the inks used are more solid. Consequently, the "fattening" is less. On the other hand, said solid inks tend to "draw" the material to be printed, particularly paper, and therefore can to be used only on papers of a certain quality.

Applicant, faced with the problems set forth hereinabove, has recommended lightening said print, particularly in order to reduce the "fattening" and to facilitate print, more precisely to create small, non-inkphilic surfaces in the inkphilic surfaces. This technique of lightening has been described in Patent Application FR-A-2 660 245. It has given good results particularly on matt and/or ordinary papers, but it is delicate to employ on an industrial scale, particularly on coated and/or smooth papers.

In fact, by using a screen 120 and a value of 5% for example for said lightening, there are generated in the inkphilic surfaces non-inkphilic surfaces of 2240 $\mu m^2$. Such a lightening causes the disappearance, partly and even totally, of too large a number of the dots which constitute the inkphilic surface representing the document to be printed. Print is removed and this may be seen in the details. There is also a loss in density. This has proved unacceptable in too numerous works.

By using, for the same lightening of 5%, a much finer screen, a screen 600 for example, there are generated in the inkphilic surfaces non-inkphilic surfaces which are very small (88 $\mu m^2$) and very numerous (about 25 times more). The inkphilic surface of the plate is thus riddled with these small surfaces which unfortunately render it fragile. Furthermore, it is very difficult to produce said tiny surfaces on an industrial scale at reasonable prices.

In general, the lightening thus carried out with a conventional screen—so-called amplitude-modulated screen— modifies the print too much, which is regrettable for numerous works. Moreover, precautions should be taken for said implementation in order to avoid the phenomenon of the moiré effect.

The implementation of the lightening, as recommended in Application FR-A-2 660 245 has therefore not, at the present time, given full satisfaction.

An original, particularly high-performance implementation thereof is proposed in accordance with the present invention. Such implementation employs a frequency-modulated screening or stochastic screening.

Such a screening does not use more or less large dot surfaces to reproduce the different values of shades, as is the case with conventional so-called amplitude-modulated screens, but a number of dots, all of the same surface, which varies for example from 1 to 100 to reproduce values of 1 to 100%. According to this screening, said dots of the same surface are distributed at random. In other words, with the frequency-modulated screening, all the dots have the same size, generally very small, but their number per surface zone (their frequency) varies depending on the value of the tones to be produced, and their distribution in space obeys a precise calculation of the assignment addresses (process of randomization). Unfortunately, such a distribution comprises the presence of agglomerates of dots.

Frequency modulation is not a novel process in the printing industry. It was used in low resolution for digital display, telecopying, etc. However, it was introduced in the printing industry only after the Seybold of Boston in April 1993. (On this occasion, the professionals learned that the Vignold group of enterprises of Essen had been working on this subject since 1992). From that date, numerous articles appeared on the subject (Deutscher Druck, Vol. 30, No. 10, February 1994, pages W11–W13 and pages W14–W15). Several companies propose this type of screening on the market. The firm Agfa proposes its Agfa Cristalraster technology, the firm Linotype-Hell its Diamond Screening technology, the firm Type Work GmbH its FINE GRAIN technology and the firm Barco its MONET technology.

However, frequency-modulated screens or stochastic screens are reserved at the present time for some rare specific printing works. In fact, they are virtually not employed insofar as their use raises serious problems.

Undeniable qualities are recognized when using such screens in printing, particularly:

the absence of rosette, the absence of moiré effect between the colours, a more tolerant registry.

However, this use is reproached with the following:

a very delicate copy of the dots on the offset plate. In fact, if for example the Cristalraster screen of Agfa which has large dots is considered, said dots present in fact only the surface of a dot of screen 1% in conventional screen a very delicate print of said dots on the paper due to a considerable fattening is difficult to avoid. In fact, on a printing machine, the dot is always reproduced with a ring. In relative percentage, this ring is all the greater as the dot is small. A faithful reproduction with so small screen dots is therefore almost impossible. unless the film has been specially modified, taking into account the document to be reproduced, the material to be printed, the ink used, etc. Such a modification of the film is no easy matter;

an irregular reproduction in the scale of the shade values. In fact, certain fractures are observed, doubtless by reason of the random formation of assembly of small dots agglutinating on one another and thus forming large inkphilic surfaces with, nearby, large, white, non-inkphilic surfaces. This particular point, detrimental to printing, seemed a priori to exclude the interest of stochastic screens from the original context of the invention, i.e. the de-printing or lightening. In fact, the agglutination of small dots generating large surfaces, their intervention for de-printing could only be strongly prejudicial.

Therefore, at the present time, frequency-modulated screens or stochastic screens are available for printing, but their use remains extremely limited.

According to the present invention, it is proposed to use them in an original context, not for offset printing, but for de-printing, in fact for lightening the printing surfaces within the meaning of Application FR-A-2 660 245.

According to its first object, the invention therefore concerns the use of frequency-modulated screening or stochastic screening to lighten the printing surfaces, in waterless or wet offset printing techniques.

It has been recalled hereinabove, on the one hand, that the principle of lightening had been described in Application FR-A-2 660 245 and, on the other hand, the characteristics of the frequency-modulated screening or stochastic screening. None qualify this screening as modulated frequency technology yet.

In this original use of said screening (for de-printing), the problems which are faced with it in its conventional use (for printing) are not encountered or are avoided by a judicious implementation (cf. hereinbelow). On the contrary, very interesting results have been surprizingly obtained.

No real difficulties are encountered for effecting lightening (this is developed in greater detail in the present text) and said lightening, in the form of small dots, of the same small area, distributed at random, is not or may remain unprejudicial at the level of quality of the print. On the contrary, the general conditions of said print are improved: such improvement being all the substantial as the material to be printed, particularly paper, is of lower quality. It has even been ascertained, quite surprizingly, that the classical problems encountered during printing with very few inkphilic surfaces were less intensive, even eliminated when said inkphilic surfaces were lightened within the meaning of the invention.

More precisely, the application of the stochastic screens proposed at the present time for the purpose, not of creating inkphilic surfaces to deposit ink on a support but, on the contary, of reducing the area of such inkphilic surfaces in accordance with the principle of lightening, has allowed said lightening to be effected:

on all papers, easily (all the works may be carried out with only one or two sizes of dots), with relatively high percentages of lightening; up to nearly 30% in certain particular cases (without detriment to the quality of printing: hardly any incidence on the contrast and density of the inked surfaces, without provoking hatchings).

with a strong positive impact on the "draught" of the inks, without generating moiré effect.

In this way, a lightening of 10–12%, perfectly acceptable if it is carried out with a stochastic screening under adequate conditions and which, at the level of the "draught" contributes considerable progress, cannot be acceptable if it is carried out with an amplitude modulated screening (problem of de-printing).

Such positive results of the stochastic lightening were in no way foreseeable.

However, said lightening is obviously carried out within reasonable limits.

According to the invention, said frequency-modulated screening is generally used for lightening said printing surfaces from 2 to 26%, advantageously from 8 to 14%. Very satisfactory results have been obtained on several quite different papers, with a lightening of 6–14%. Surprisingly, such lightenings do not prove detrimental to printing even on fine papers, insofar as they are carried out adequately.

It will be specified here that the stochastic screens most currently used at the present time are generally used for the purposes of the invention—for the purposes of printing—i.e. those producing small dots with an area of about 400 $\mu m^2$.

However, the use of stochastic screens is in no way excluded from the scope of the invention with smaller dots (with an area of about 196 $\mu m^2$ for example) for works on very fine, smooth paper (stamps, post cards);

with larger dots (with an area which may attain 1600 $\mu m^2$) for works on rough paper of the newspaper type.

The lightening according to the invention is carried out for a given work with dots of the same area, distributed at random, generally dots of about 400 $\mu m^2$. However, there is still a certain degree of freedom in the choice of the area of said dots for a given rate of lightening.

For effecting said lightening, software, films or plates adapted to generate lightened printing surfaces by a stochastic screening, are employed in conventional waterless or wet offset processes. Said films or plates constitute the second object of the present invention. As specified hereinabove, their printing surfaces, lightened by a stochastic screening, are generally lightened by 2 to 26%, advantageously from 8 to 14%.

This second object of the present invention also covers the apparatus (data-processing tools) useful for preparing the films themselves useful for producing the plates or directly useful for preparing the plates. Said apparatus contain the adequate software. In fact, the invention also has for an object the use in waterless or wet offset printing techniques, of software adapted to generate printing surfaces lightened by a stochastic screening, for the preparation of films or plates.

Said films or plates adapted to generate printing surfaces lightened by a stochastic screening, are described hereinafter in greater detail.

Concerning the films, lightened within the meaning of the invention, they present, depending on whether it is question of films representing the document to be reproduced which are negative or positive, small black lightening surfaces in the transparent parts or small transparent lightening surfaces in the black parts, said small surfaces being distributed in characteristic manner by means of a stochastic screening.

Such films are advantageously produced at the photo-engraver's. It is possible:

either to produce the films (positive or negative) so that the inkphilic parts reproducing the document have been lightened by means of stochastic screening;

or to use, for photographing the document to be reproduced, pre-processed films on which the small black or transparent surfaces have been previously introduced by printing or by exposure.

In fact, an adequate exposure is effected on the blank films in order to generate small black lightening surfaces in the transparent parts or small transparent lightening surfaces in the black parts, knowing that the light sent onto said blank films generates black surfaces thereon. This technique of exposure does not raise any particular problem.

However, Applicant has ascertained that its implementation for generating small transparent lightening surfaces in the black parts raised a problem in certain contexts beyond a certain lightening rate. Agglomerates of lightening dots detrimental to printing were then observed. The lightening rate beyond which the observation of such agglomerates is intolerable obviously depends on the conditions of printing.

In any case, Applicant has contrived to prepare the films thereby lightening the printing at lightening rates greater than 5%, without detriment to said printing made on any paper and any machine. It is thanks to this contrivance that it is possible to recommend within the framework of the present invention the lightening, by means of a stochastic screening, up to rates close to 30% and more particularly up to rates of about 14% on very fine papers.

Thus, in order to prepare films which present small transparent lightening surfaces in the black parts, films useful for preparing positive plates, there are two ways of proceeding.

According to the first, conventional, way, a blank film is exposed in order to create, directly thereon, the small transparent surfaces required, distributed at random. The film obtained will not present any agglomerate if said small surfaces are introduced at low rate (low lightening rate) and will present some in an increasingly larger quantity if the quantity of introduction of such small surfaces is increased (high lightening rate). However, this may remain acceptable under certain particular conditions of printing.

According to the second, original, way, one proceeds in two steps. A first film is exposed in order to create thereon small black surfaces, distributed at random, and then said first film is copied on a second which constitutes the sought after lightened film. Surprisingly, thanks to this two-step technique, films with high rates of lightening can be prepared which do not present agglomerates of transparent surfaces.

The processed films—lightened by means of a stochastic screening—are used for exposing plates. Said plates characteristically present inkphilic surfaces and non-inkphilic surfaces; at least one part of said inkphilic surfaces containing small non-inkphilic lightening surfaces, distributed by means of a stochastic screening. It will be recalled here that said small surfaces, both at the level of the plates and of the films, theoretically present the same surface and are distributed at random (stochastic screening).

The plates lightened within the meaning of the invention are positive or negative plates. On these two types of plates, the lightening has not been effected in the same manner.

Concerning the positive plates, it is known that the photosensitive inkphilic layer is, by exposure, rendered soluble in the developer. It is therefore necessary, in order to create small, non-inkphilic surfaces in the photosensitive inkphilic layer, to send light through a film which presents the adequate small, transparent surfaces by means of a stochastic screening). This raises no problem. In fact, the man skilled in the art knows that a film presenting transparent surfaces of an area included between about 200 and 2000 $\mu m^2$ is copied without any difficulty.

The exposure of the positive plate, through said film, may be effected in different stages. It is advantageously effected upstream of the printing process, prior to any use of the plate. It may thus be envisaged to place on the market pre-exposed plates (having undergone lightening exposure and advantageously non-developed). Such positive plates form an integral part of the present invention. They are characterized in that they comprise a photosensitive inkphilic layer which has been exposed with a stochastic screen.

Such pre-exposed plates may be used:

directly for a second exposure with a positive film which comprises the document to be printed and a single development;

for a first development followed by a second exposure with a positive film which comprises the document to be printed and a second development.

In accordance with other variants, it is possible:

to expose, a first time, a positive plate with the document to be printed, develop it, take it for a second exposure through said lightening film and a second development (the small non-inkphilic surfaces have thus been introduced in the inkphilic surfaces);

to expose a positive plate with a single positive film which comprises both the document to be reproduced and the small transparent surfaces in the black parts and to develop said plate.

Concerning the negative plates, it is known, on the contrary, that the photosensitive inkphilic layer is, by exposure, rendered insoluble in the developer. It is therefore necessary, in order to create small non-inkphilic surfaces in the inkphilic parts, to stop the light through a film which presents the adequate small black surfaces (by means of a stochastic screening).

This may be effected in accordance with different variants.

According to a first variant, that necessary may be done at the level of the negative film which comprises the document to be printed. Said film will have been pre-processed in order to contain the adequate small surfaces.

According to a second variant, that necessary may be done at the level of the copy of the plate by employing two films: a film which presents the adequate small black surfaces (to stop the light) and a negative film which comprises the document to be printed. Manipulation of these two films may prove to be delicate.

In accordance with another variant, that necessary may be done at the level of the plate, before using it with the film which comprises the document to be reproduced. Small opaque surfaces are deposited on the photosensitive inkphilic layer of said plate. To that end, a film which comprises the small transparent lightening surfaces may be copied in a first step on a negative, preferably waterless offset plate. After exposure and development, a plate is obtained whose inkphilic parts represent the small surfaces, which will deposit the ink on the negative plates. To reinforce the opacity of the ink thus deposited, talcum, carbon black or equivalent is passed. One is thus certain to stop the light completely at the level of said small surfaces. It has furthermore been observed that the ink/talcum or carbon black assembly which gives said small surfaces a certain relief then reduces the time to make the vacuum in the exposure frame. It acts as an anti-blur agent when a vacuum is created in said frame for a perfect plating of the film comprising the document to be reproduced. This process is therefore particularly preferred. Said ink may also be deposited directly on the plate, by ink jet, which will stop the light.

According to another variant, that necessary may be done at the level of the preparation of the plate, at the level of the connection of its hydrophilic surface and its photosensitive inkphilic layer. A matter may thus be deposited on said hydrophilic surface, which prevents the adherence of the negative inkphilic layer at places (distributed by means of a stochastic screen), which will represent said small non-inkphilic surfaces in the inkphilic parts. This technique may in the same way be carried out for preparing positive plates.

Whatever the technique retained, the lightening by means of a stochastic screening does not raise any serious technical problem. According to the invention, only small dots are removed, in relatively small quantity. The balance of such lightening is, however, very positive.

The invention is illustrated by the following Examples:

EXAMPLE 1

The Agfa Cristalraster stochastic screen of the firm Agfa, "large dot" screen, is used for generating, at a rate of 5%, transparent surfaces each of 362 $\mu m^2$, on a film.

A pre-sensitized, positive plate is taken and exposed with said film in a frame. Thousands of small surfaces of 362 $\mu m^2$ thus see the light and may be eliminated at development.

Said plate is then exposed (second exposure) with the pattern to be printed, it is developed and gummed, as usual. Considering said plate with a magnifying glass, it may be seen that all its inkphilic parts contain, distributed at random, small surfaces where the inkphilic layer has been eliminated at development.

The plate is placed on-machine. Said machine is fed with ordinary paper which requires, for a good print, a thinned down ink and a thick film of ink.

It is ascertained that the print with such a plate is of quality greater than that obtained with a "non-lightened" plate. Said printing is, furthermore, carried out with fewer washings of the blanket and it is observed that the paper does not slide in the clips.

EXAMPLE 2

A positive plate is copied and developed normally.

Said developed plate is taken and exposed with a "lightened" film of the type prepared in Example 1.

After development (second development), a plate of the type obtained in Example 1 is obtained. Its inkphilic parts contain small non-inkphilic surfaces (without inkphilic layer) distributed at random.

The results at print are identical to those of Example 1.

EXAMPLE 3

A "lightened" film of the type prepared in Example 1 is used for copying a negative waterless offset plate.

With said plate, placed on-machine, thousands of small dots are deposited on negative offset plates. Said dots are rendered more opaque by coating them with talcum or with carbon black. Said small dots, rendered opaque, are thus capable of stopping the light (of preventing hardening of the inkphilic layer).

Said pre-processed plate is exposed with a negative film of the pattern to be printed.

This plate ensures a higher quality of print, with fewer problems. It is also ascertained that the small dots, with a height of about 2 $\mu m$, facilitate evacuation of the air when a vacuum is created in the frame. In fact, they behave as "anti-blur" agents, by allowing the film to be coated around them.

EXAMPLE 4

A pre-sensitized positive plate is taken and exposed in a frame with a film made with a MONET stochastic screen of the firm Barco, of which the transparent dots have an area of about 390 $\mu m^2$ and represent 12% of the surface of the film. Said film was made in the manner specified hereinafter.

A first film was prepared in conventional manner with 88% of transparent surfaces and therefore 12% of small black dots, dispersed virtually without agglomerate. Said film was then copied on a second film in a frame. After development, said second film presents 12% of tranparent surfaces, formed by small dots of about 390 $\mu m^2$. Said small dots present virtually no awkward agglomerates.

Said plate is then exposed (second exposure) with the pattern to be printed; it is developed and gummed as usual.

With a microscope, it may be seen that all the inkphilic parts contain small isolated surfaces where the layer left at development, and which are disposed at random.

Said plate is placed on-machine and reproductions of photographs are printed in black on fine coated paper.

It is ascertained that the print is well stripped and that printing is effected more easily; the sheet of paper adhering little to the rubber blanket.

EXAMPLE 5

One proceeds as in Example 4, but with a film having only 4% of transparent surface formed by small transparent dots of 390 $\mu m^2$.

Printing and the conditions of printing are substantially inferior to those of Example 4.

EXAMPLE 6 (comparative example)

A film having 12% of transparent surfaces (as in Example 4) but made with a conventional screen (amplitude-modulated screen) which has 300 lines to the inch (very fine screen) is used for lightening.

In order to obtain the 12% of transparent surface, the dots have a surface of about 850 $\mu m^2$. After placing the lightened plate with said conventional screen on machine, it is ascertained that the density in the solid tints lowered by about 10% and that white dots are visible as soon as inking lowers a little.

Moreover, the reproductions of the photographs are more contrasted; fine details have more or less disappeared and thin lines are hatched in places. Furthermore, a certain moiré effect is observed, if the difference of 30° in the positioning of the two films (lightening film and film comprising the pattern to be printed) has not been respected.

EXAMPLE 7

One proceeds as in Example 4, but the transparent surface represents 16% of the surface of the film and this without awkward agglomerate of dots.

The paper is of the newspaper type and the reproductions are made under conventional newspaper printing conditions.

The print and the printing conditions are good.

EXAMPLE 8

One proceeds as in Example 4, but the lightening film has been made with the stochastic screen in conventional manner (directly).

The quality of printing, on a fine coated paper, is inferior (presence of agglomerates of the small lightening dots).

However, the quality obtained would be acceptable with other printing supports of lower quality.

What is claimed is:

1. A printing plate for use in waterless or wet offset printing having a printing surface comprising inkphilic and non-inkphilic areas, said inkphilic area defining the image desired to have ink when printing is effected, wherein at least a part of said inkphilic area is lightened by inclusion of a plurality of small non-inkphilic surfaces thereon and wherein said small non-inkphilic surfaces are randomly distributed small dots of the same small area in said inkphilic area such that when ink is applied to said plate and adheres to the inkphilic area defining the desired image, said ink is prevented from adhering to said small, randomly distributed non-inkphilic surfaces.

2. The printing plate according to claim 1, wherein the total area of said small, randomly distributed, non-inkphilic surfaces is from 2 to 26% of said inkphilic area lightened thereby.

3. The printing plate according to claim 1, wherein the total area of said small, randomly distributed, non-inkphilic surfaces is from 8 to 14% of said inkphilic area lightened thereby.

4. The printing plate according to claim 1, where the said small randomly distributed, non-inkphilic surfaces are distributed according to a frequency-modulated screening or stochastic screening.

5. The printing plate of claim 4, wherein said small, randomly distributed non-inkphilic surfaces comprise dots having an area between about 196 and 1600 $\mu m^2$.

6. The printing plate of claim 4, wherein said small, randomly distributed non-inkphilic surfaces comprise dots having an area of about 400 $\mu m^2$.

* * * * *